United States Patent [19]

Yagi

[11] Patent Number: 5,231,396
[45] Date of Patent: Jul. 27, 1993

[54] R-2R DIGITAL-TO-ANALOG CONVERTER HAVING TRANSISTORS OF EQUAL EMITTER SIZE

[75] Inventor: Yasuo Yagi, Tokyo, Japan

[73] Assignee: Pioneer Electric Corporation, Tokyo, Japan

[21] Appl. No.: 818,820

[22] Filed: Jan. 10, 1992

[30] Foreign Application Priority Data

Feb. 20, 1991 [JP] Japan .................................. 3-45630

[51] Int. Cl.⁵ ............................................ H03M 1/78
[52] U.S. Cl. ................................. 341/154; 341/118
[58] Field of Search .............. 341/118, 119, 120, 144, 341/153, 154

[56] References Cited

U.S. PATENT DOCUMENTS

| | | | |
|---|---|---|---|
| 3,940,760 | 2/1976 | Brokaw | 341/119 |
| 4,176,344 | 11/1979 | Saari et al. | 341/119 |
| 4,306,225 | 12/1981 | Geller et al. | 341/153 |
| 4,521,765 | 6/1985 | Wang et al. | 341/154 |
| 4,567,463 | 1/1986 | Naylor | 341/118 |
| 4,701,694 | 10/1987 | Penney et al. | 341/144 |

*Primary Examiner*—Marc Hoff
*Attorney, Agent, or Firm*—Sughrue, Mion, Zinn, Macpeak & Seas

[57] ABSTRACT

A digital-to-analog converter has a plurality of switches, each of which being responsive to a bit of a digital signal having n bits, to selectively pass therethrough a weighted current having a magnitude of $2^{i-1}Ic$ where i is an ith bit. The respective weighted current flows through a corresponding transistor into a resistor ladder circuit. The resistor ladder circuit has a plurality of arms, each of which receive a weighted current from the emitter of a corresponding transistor. The digital-to-analog converter further includes a plurality of base resistors connected in series such that the bases of the transistors are connected with corresponding junctions of the base resistors r1-r7. The plurality of base resistors carry a first current therethrough. A current control circuit BC for controlling the first current through the series-connected base resistors to maintain emitter voltages of two predetermined transistors of the plurality of transistors such that the emitter voltages of the two predetermined transistors are always the same.

3 Claims, 2 Drawing Sheets

R-2R DIGITAL-TO-ANALOG CONVERTER HAVING TRANSISTORS OF EQUAL EMITTER SIZE

BACKGROUND OF THE INVENTION

The present invention relates to a current-adding type digital-to-analog converter having a resistor ladder circuit.

PRIOR ART

FIG. 2 shows a prior art digital-to-analog converter where a digital input signal having eight bits, D1 to D8, is converted into an analog signal.

In the figure, a resistor ladder circuit has a plurality of resistors R connected in series and a plurality of resistors 2R connected to junctions of the resistors R. Each of the resistors 2R has twice as high a resistance as the resistors R. Transistors Q1–Q8 are inserted between common terminals a1–a8 of switches S1–S8 and the resistors 2R. The transistors Q1–Q8 have bases connected to a voltage source Es of a constant voltage. The switches S1–S8 are switched under control of a corresponding bit data D1–D8 such that a switch Si(i=1, 2, 3, ...) is shifted to the position $c_i$ when the bit data $D_i$ is a logic 0 and to the position $b_i$ when logic 1. The positions $b_i$ are connected to the negative input terminal of an operational amplifier OP which has a feedback resistor Rf connected between the output terminal and the negative input terminal.

The resistance of the ladder circuit is always 2R when the circuit is seen to the right from any one of points A, B, C, ... and so on. The currents through the transistors Q2, Q3, ..., Q8 are given by $2^{i-1}Ic$, so that the currents are 2Ic, 4Ic, ..., 128Ic where Ic is the collector current of the transistor Q1. Thus, the current through the feedback resistor Rf is Ic, 2Ic, 4Ic, ..., 128Ic depending on the positions of the switches S1–S8 driven by the bits D1–D8 where D1 is an LSB and D8 is an MSB. Then, the operational amplifier OP provides at the output thereof an analog signal $e_o$ given by the following equation.

$$e_o = -\frac{Es\, Rf}{2R} \sum_{i=1}^{n} 2^{-(i-1)} D_i \quad (1)$$

With the aforementioned prior art converter, the collector current of Q8 is 128 times larger than that of Q1. In general, the base-to-emitter voltage Vbe of a transistor is given by the following equation.

$$Vbe = \frac{KT}{q} \ln \frac{Ic}{Is} \quad (2)$$

where K is Boltzmann's constant, T is an absolute temperature, q is the charge of an electron, Ic is a collector current, and Is is a reverse saturation current.

The base-to-emitter voltage Vbei of Qi is given by $$Vbei = \frac{KT}{q} \ln \frac{2^{i-1} Ic}{Is} \quad (3)$$

This indicates that the voltage Vbe is increasingly high for transistors closer to the MSB. As a result, the collector currents of Q1–Q8 are not maintained in a relation such that the collector currents are given by $2^{i-1}Ic$. This causes poor linearity of the output signal $e_o$.

If the emitter size is made n times larger, the base-to-emitter voltage of transistor is given by $$Vbe = \frac{KT}{q} \ln \frac{Ic}{n\, Is} \quad (4)$$

If the emitter size is increased by a factor of $2^{i-1}$ for an ith transistor Qi from the LSB where i is 1, 2, 3, ..., 8, then the base-to-emitter voltage Vbei is given by equations (3) and (4) as follows:

$$\begin{aligned} Vbei &= \frac{KT}{q} \ln \frac{2^{i-1} Ic}{2^{i-1} Is} \\ &= \frac{KT}{q} \ln \frac{Ic}{Is} \end{aligned} \quad (5)$$

This allows the base-to-emitter voltages Vbe of all the transistors to be the same, ensuring the linearity of the output signal $e_o$. However, this approach of improving linearity of the output $e_o$ requires that the closer to MSB the transistor is, the larger the emitter size becomes. Then, a larger emitter size requires a larger chip area, being disadvantageous in integrating the whole circuit in a single chip. In fact, the largest emitter size differs from the smallest emitter size by a factor of 128 in this prior art converter. Eight transistors of different emitter sizes must be fabricated with high accuracy in relative size.

SUMMARY OF THE INVENTION

An object of the present invention is to provide a current-adding type digital-to-analog converter capable of providing an output with good linearity while also ensuring the emitter size of the transistors to be the same.

A digital-to-analog converter according to the invention has a plurality of switches, each of which is responsive to a bit of a digital signal having n bits to pass therethrough a weighted current having a magnitude of $2^{i-1}Ic$ where i is an ith bit of a total of n bits. The respective weighted currents flow through a plurality of transistors into a resistor ladder circuit. The resistor ladder circuit has a plurality of arms, each of which receives a weighted current from the emitter of a corresponding transistor. The digital-to-analog converter of the invention further includes a plurality of base resistors connected in series such that the bases of the transistors are connected with corresponding junctions of the base resistors r1–r7. The plurality of base resistors carry a first current therethrough. A base-current control circuit BC controls the first current through the base resistors to maintain emitter voltages of two predetermined transistors of the plurality of transistors such that the emitter voltages of the two predetermined transistors are always the same.

BRIEF DESCRIPTION OF THE DRAWINGS

Features and other objects of the invention will be more apparent from the description of preferred embodiment with reference to the accompanying drawings in which.

DETAILED DESCRIPTION OF THE PREFERRED EMBODIMENT

Figure 1:
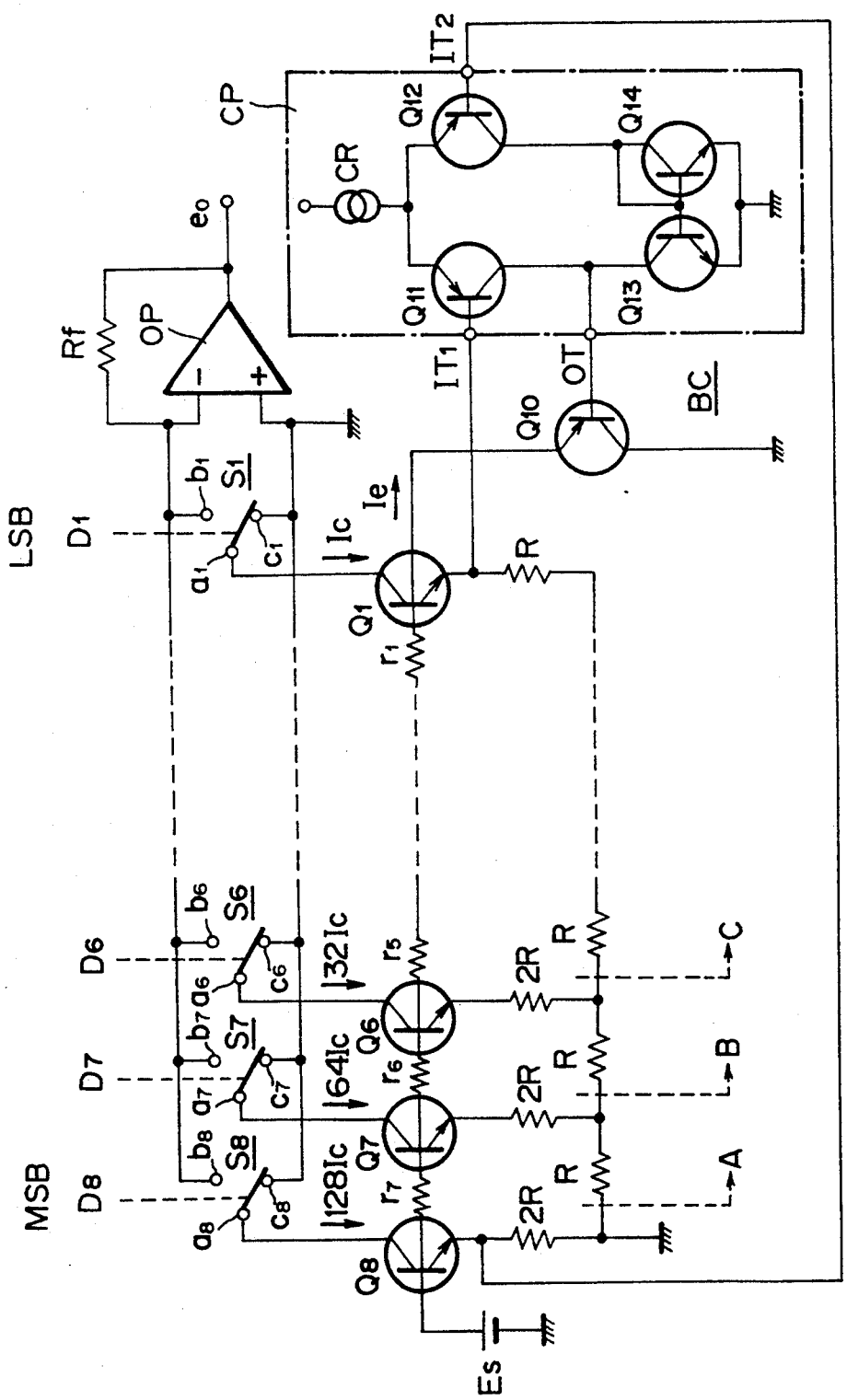
FIG. 1 is a schematic diagram showing an embodiment of a digital-to-analog converter according to the present invention.
Figure 2:
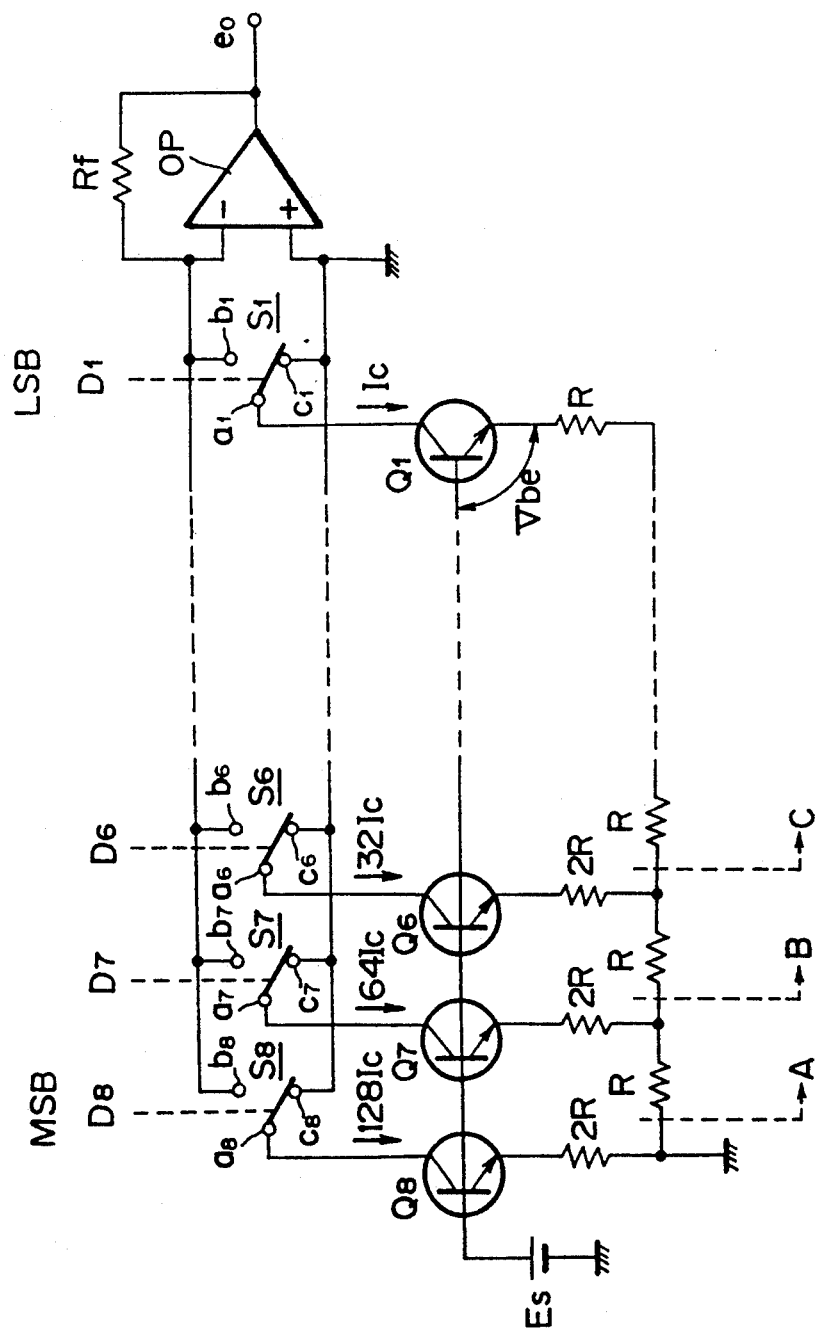
FIG. 2 is a schematic diagram showing a prior art digital-to-analog converter.

FIG. 1 is a schematic diagram showing an embodiment of a digital-to-analog converter according to the present invention. The circuit in FIG. 1 differs from the prior art converter of FIG. 2 in that the circuit includes a voltage comparing circuit CP, a PNP transistor Q10, and base resistors r1–r7. The transistor Q10 is inserted between the base of Q1 and the ground, and has a base connected to an output terminal OT of the voltage-comparing circuit CP. The base resistors r1–r7 are inserted between the bases of the transistors Q1–Q8 whose emitters are of the same size. An input terminal IT1 of the voltage-comparing circuit CP is connected to the emitter of Q1 and an input terminal IT2 to the emitter of Q8. The transistor Q10 and the voltage-comparing circuit Cp are combined to form a base current controlling circuit BC.

The voltage-comparing circuit CP has a differential circuit consisting of PNP transistors Q11 and Q12 which drive a current mirror circuit consisting of NPN transistors Q13 and Q14. The transistor Q14 is in the form of a diode-connection. The emitters of Q11 and Q12 are connected to a constant current source CR and the emitters of Q13 and Q14 to the ground. The base of Q11 is connected to the input terminal IT1 and the base of Q12 to the input terminal IT2. The junction of the collector of Q11 and the collector of Q13 is connected to the output terminal OT.

In order to maintain the emitter of Q1–Q8 at the same voltage, the voltage-comparing circuit CP compares the emitter voltage of Q1 with that of Q8 to controllably drive the base of Q10 so that the emitter of Q1 is always the same as that of the transistor Q8.

That is, when the emitter voltage of Q1 goes up relative to the emitter voltage of Q8, the voltage-comparing circuit detects the difference between the two voltages and causes the base voltage of Q10 to decrease, thereby increasing the emitter current Ie of Q10. Thus, the voltage drops across the base resistors r1–r7 increases, causing the base voltages of Q1–Q7 to decrease. The decrease of base voltage of Q1 causes the emitter voltage of Q1 to decrease to become the same as the emitter voltage of Q8.

When the emitter voltage of Q1 goes down relative to the emitter voltage of Q8, the voltage-comparing circuit CP detects the difference between the two voltages and causes the base voltage of Q10 to increase, thereby decreasing the emitter current Ie of Q10. Then, the voltage drops across the base resistors r1–r7 decrease, causing the base voltages of Q1–Q7 to increase. The increase of base voltage of Q1 causes the emitter voltage of Q1 to increase to become the same as the emitter voltage of Q8.

In this manner, even though the base-to-emitter voltages of a plurality of transistors are different from one another, the emitter voltages of the transistors are maintained at the same voltage so that the currents flowing through the transistors into the resistor ladder circuit are in a relation of $2^{i-1}$Ic for a transistor Qi where Qi is an ith transistor from the LSB and Ic is the current through the transistor Q1 for LSB.

While the embodiment has been described with respect to a converter where the emitter voltages of transistors Q1 for LSB and Q8 for MSB are controlled such that they are always the same, a combination of any two of the transistors Q1 to Q8 may also be controlled for the same result.

What is claimed is:

1. A digital-to-analog converter having a plurality of switches, each of which is controlled by a bit of a digital signal, to pass therethrough a weighted current having a magnitude of $2^{i-1}$Ic, where i is a positive integer and Ic represents a current corresponding to a least significant bit of the digital signal, a plurality of first transistors through which said weighted currents flow, and a resistor ladder circuit with a plurality of resistor-arms, each receiving a weighted current from an emitter of a corresponding first transistor, said digital-to-analog converter comprising:

a plurality of base resistors connected in series such that bases of said plurality of first transistors are connected with corresponding junctions of said base resistors connected in series, said plurality of base resistors carrying a first current therethrough; and a current control circuit for controlling said first current through said base resistors to maintain emitter voltages of two predetermined first transistors of said plurality of first transistors such that the emitter voltages of the two predetermined first transistors are equal, wherein said current control circuit includes means for comparing the emitter voltages of said two predetermined first transistors, and means, connected between an output of said comparing means and a base of one of said two predetermined first transistors, for controllably driving said first current in accordance with the output of said comparing means such that said emitter voltages of the two predetermined first transistors are substantially equal.

2. A digital-to-analog converter according to claim 1, wherein said plurality of first transistors have emitters of equal size.

3. A digital-to-analog converter having a plurality of switches, each of which is controlled by a bit of a digital signal, to pass therethrough a weighted current having a magnitude of $2^{i-1}$Ic, where i is a positive integer and Ic represents a current corresponding to a least significant bit of the digital signal, a plurality of first transistors through which said weighted currents flow, and a resistor ladder circuit with a plurality of resistor-arms, each receiving a weighted current from an emitter of a corresponding first transistor, said digital-to-analog converter comprising:

a plurality of base resistors connected in series such that bases of said plurality of first transistors are connected with corresponding junctions of said base resistors connected in series, said plurality of base resistors carrying a first current therethrough; and a current control circuit for controlling said first current through said base resistors to maintain emitter voltages of two predetermined first transistors of said plurality of first transistors such that the emitter voltages of the two predetermined first transistors are equal, wherein said current control circuit further includes:

a second transistor inserted in series with said plurality of base resistors; and a voltage comparing circuit for comparing the emitter voltages of the two predetermined first transistors of said plurality of first transistors so as to drive said second transistor such that said first current is controlled to maintain the emitter voltages of two predetermined first transistors at the same level.

* * * * *